(12) United States Patent
Candage et al.

(10) Patent No.: US 9,685,923 B2
(45) Date of Patent: Jun. 20, 2017

(54) COMMUNICATION OVER A VOLTAGE ISOLATION BARRIER

(71) Applicant: Infineon Technologies Americas Corp., El Segundo, CA (US)

(72) Inventors: Anthony B. Candage, Meredith, NH (US); Aswath Krishnan Krishnamoorthy, Providence, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/836,424

(22) Filed: Aug. 26, 2015

(65) Prior Publication Data
US 2016/0065398 A1 Mar. 3, 2016

(51) Int. Cl.
| | |
|---|---|
| H04B 7/02 | (2006.01) |
| H04L 1/02 | (2006.01) |
| H03G 3/20 | (2006.01) |
| H04B 15/00 | (2006.01) |
| H03F 3/45 | (2006.01) |
| H03F 1/26 | (2006.01) |
| H04L 25/02 | (2006.01) |
| H04L 25/08 | (2006.01) |
| H03F 1/32 | (2006.01) |
| H03G 3/30 | (2006.01) |

(52) U.S. Cl.
CPC ............... *H03G 3/20* (2013.01); *H03F 1/26* (2013.01); *H03F 1/3211* (2013.01); *H03F 3/45179* (2013.01); *H03F 3/45632* (2013.01); *H04B 15/00* (2013.01); *H04L 25/0266* (2013.01); *H04L 25/085* (2013.01); *H03F 2200/06* (2013.01); *H03F 2200/189* (2013.01); *H03F 2200/453* (2013.01); *H03F 2203/45562* (2013.01); *H03G 3/3052* (2013.01)

(58) Field of Classification Search
CPC ..... H04L 1/0618; H04L 1/06; H04L 25/0204; H04L 1/0026; H04L 1/0003; H04B 7/0417; H04B 7/0669; H04B 7/2048; H04J 3/0682; H04J 3/0638
USPC ................. 375/237–238, 242–254, 256–352
See application file for complete search history.

(56) References Cited

U.S. PATENT DOCUMENTS

| | | | | |
|---|---|---|---|---|
| 3,806,806 A | * | 4/1974 | Brolin ................... | H03M 3/022 341/143 |
| 4,618,941 A | * | 10/1986 | Linder ................... | H03H 17/06 360/41 |

(Continued)

*Primary Examiner* — James M Perez
(74) *Attorney, Agent, or Firm* — Chapin IP Law, LLC

(57) ABSTRACT

A transmitter circuit comprises: an input, an encoder circuit, and a transmitter. During operation, the transmitter circuit receives an input signal. The encoder circuit encodes the received input signal into an encoded signal. The encoder circuit produces the encoded signal: i) to indicate changing states of the input signal, and ii) to include a supplemental transient signal with respect to the received input signal. The transmitter transmits the encoded signal from an output of the first circuit over a link to a second circuit such as a receiver circuit. A receiver decodes the encoded signal to reproduce a rendition of the input signal to control remote power supply circuitry. Presence of the supplemental transient signal in the encoded signal indicates to the receiver circuit that the first circuit actively transmits the output signal even though there may not be any change to a current state of the input signal.

33 Claims, 6 Drawing Sheets

(56) References Cited

U.S. PATENT DOCUMENTS

| | | | | |
|---|---|---|---|---|
| 4,660,162 A * | 4/1987 | Berlinsky | G06F 7/544 | 332/109 |
| 4,817,115 A * | 3/1989 | Campo | H04L 25/4902 | 375/238 |
| 5,550,864 A * | 8/1996 | Toy | H04L 25/4904 | 341/70 |
| 5,991,308 A * | 11/1999 | Fuhrmann | H03M 13/256 | 348/E7.07 |
| 6,043,633 A * | 3/2000 | Lev | H02M 1/4225 | 323/222 |
| 6,215,435 B1 * | 4/2001 | Parry | H02P 27/06 | 318/811 |
| 6,337,591 B1 * | 1/2002 | Maggiolino | H03K 7/08 | 327/172 |
| 6,665,308 B1 * | 12/2003 | Rakib | H03M 13/256 | 348/E7.07 |
| 6,812,666 B2 * | 11/2004 | Takahashi | H03M 5/08 | 318/599 |
| 7,176,721 B2 * | 2/2007 | Ho | H04L 25/028 | 326/26 |
| RE40,549 E * | 10/2008 | Maggiolino | H03K 7/08 | 327/172 |
| 8,024,138 B2 * | 9/2011 | Carroll | G01R 19/2513 | 702/189 |
| 8,184,456 B1 * | 5/2012 | Jain | H02M 5/29 | 363/21.02 |
| 8,344,712 B2 * | 1/2013 | Martin | H02M 3/157 | 323/222 |
| 8,816,661 B2 * | 8/2014 | Candage | H02M 3/157 | 323/271 |
| 9,318,975 B2 * | 4/2016 | Venhaus | H02M 7/537 | |
| 2001/0001616 A1 * | 5/2001 | Rakib | H03M 13/256 | 375/259 |
| 2002/0063546 A1 * | 5/2002 | Takahashi | G05B 11/28 | 318/599 |
| 2010/0188062 A1 * | 7/2010 | Candage | H02M 3/157 | 323/271 |
| 2011/0032734 A1 * | 2/2011 | Melanson | H02M 1/14 | 363/37 |
| 2013/0033312 A1 * | 2/2013 | Lu | H03F 1/223 | 330/69 |
| 2013/0114758 A1 * | 5/2013 | Park | H04L 25/0272 | 375/295 |
| 2014/0112401 A1 * | 4/2014 | Wiley | H04L 25/0272 | 375/259 |
| 2014/0125126 A1 * | 5/2014 | Akizuki | H01P 5/12 | 307/18 |
| 2015/0103986 A1 * | 4/2015 | Chen | H04B 3/20 | 379/93.05 |
| 2016/0056850 A1 * | 2/2016 | Nagase | H03K 5/04 | 375/340 |

* cited by examiner

COMMUNICATION OVER A VOLTAGE ISOLATION BARRIER

RELATED APPLICATIONS

This application is related to and claims the benefit of earlier filed U.S. Provisional Patent Application Ser. No. 62/042,421 entitled "Novel High Breakdown Voltage Isolation System Utilizing Capacitive Coupling Techniques,", filed on Aug. 27, 2014, the entire teachings of which are incorporated herein by this reference.

BACKGROUND

As is well known, conventional multi-phase voltage regulators typically control activation and deactivation of respective control and synchronous switches in a power supply phase to produce an output voltage that powers a respective load.

In accordance with conventional power supply control circuitry, when an output voltage of the power supply drops below a desired set point, the power supply control circuitry activates a respective control switch to supply more current to a load driven by the output voltage. Conversely, when the output voltage rises substantially above the set point, the power supply control circuitry deactivates the control switch and activates the synchronous switch.

Via repeated control of the control switch of the synchronous switch in a manner as discussed above, the power supply control circuitry maintains the output voltage of the power supply within a desired range.

BRIEF DESCRIPTION

In most power supply applications, it is a fairly straightforward task (such as using traces on a printed circuit board) to connect power supply control circuitry to a target circuit such as one or more power supply switches. However, in certain instances, power supply control circuitry and corresponding controlled target circuit reside on isolated substrates and are subject to high voltage variations. Isolation of the substrates and exposure of circuitry to high voltage variations makes it difficult for conventional power supply applications to reliably control a corresponding target circuit from a remote location. In other words, if a control signal conveyed over a communication link is not accurately replicated on a receiver side, it is not possible to accurately control the target circuit.

In contrast to conventional control techniques, embodiments herein include a first circuit (such as a transmitter circuit) comprising: an input, an encoder circuit, and a transmitter. During operation, the input of the first circuit receives an input signal (such as a control signal). The encoder circuit encodes the received input signal into an encoded signal. As further described herein, the encoder circuit produces the encoded signal: i) to indicate changing states of the input signal, and ii) to include a supplemental transient signal with respect to the received input signal. The transmitter transmits the encoded signal from an output of the first circuit over a link to a second circuit such as a receiver circuit. The receiver circuit decodes the encoded signal to reproduce a rendition of the input signal. In one embodiment, the reproduced input signal is used to control target power supply circuitry such as a control switch and synchronous switch. By way of non-limiting example embodiment, the control switch and the synchronous switch can be disposed in a DC-DC converter.

In accordance with further embodiments, presence of the supplemental transient signal in the encoded signal indicates to the receiver circuit that the first circuit actively transmits the encoded signal even though there may not be any change to a current state of the input signal. In other words, assume that the input signal is set to a logic low level. As further described herein, the encoded signal indicates the logic low level as well as includes the supplemental transient signal to indicate that the transmitter continues to transmit the encoded signal. Conversely, the input signal may be set to a logic high level. In such an instance, the encoded signal indicates the logic high level as well as includes the supplemental transient signal to indicate that the transmitter continues to transmit the encoded signal.

In accordance with yet further embodiments, voltage isolator circuitry (such as a high-voltage isolation barrier) is disposed between the transmitter circuit and the receiver circuit. During operation, the voltage isolator circuitry passes AC attributes of the encoded signal to the respective receiver circuit and blocks DC attributes of the encoded signal from being passed to the respective receiver circuit.

In yet further embodiments, the transmitter transmits the encoded signal as a differential signal to the receiver circuit. The receiver circuit includes a decoder that decodes the differential signal into a reproduced rendition of the input signal (control signal).

By way of non-limiting example, the reproduced input signal can be used to control states of a respective control switch and synchronous switch.

These and other more specific embodiments are disclosed in more detail below.

Note that embodiments herein can include a transmitter/receiver configuration of one or more processor devices to carry out and/or support any or all of the method operations disclosed herein. In other words, one or more computerized devices or processors can be programmed and/or configured to operate as explained herein to carry out different embodiments.

Yet other embodiments herein include software programs to perform some or all of the steps and operations summarized above and disclosed in detail below. One such embodiment comprises a computer program product that has a non-transitory computer-storage medium (e.g., memory, disk, flash, . . . ) including computer program logic encoded thereon that, when performed in a computerized device having a processor and corresponding memory, programs the processor to perform the operations disclosed herein. Such arrangements are typically provided as software, code and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be installed onto a controller to cause the controller to perform the techniques explained herein.

Accordingly, one particular embodiment of the present disclosure is directed to a computer program product that includes a computer readable medium having instructions stored thereon for supporting operations such as conveying data to a target recipient over a communication link. For example, in one embodiment, the instructions, when carried out by computer processor hardware, cause the computer processor hardware to: receive an input signal; encode the received input signal as an encoded signal, the encoded signal: i) indicating changing states of the input signal, and ii) including a supplemental transient signal with respect to the received input signal; transmit the encoded signal (such as via a differential signal) from an output of a transmitter circuit to a receiver circuit, presence of the supplemental transient signal in the transmitted encoded signal indicating that a corresponding first circuit actively transmits the encoded input signal; receive the encoded signal at a corresponding target power supply circuit; decode the received encoded signal to reproduce a rendition of the input signal; and utilize the reproduced rendition of the input signal to control switches in the power supply circuit The ordering of the steps has been added for clarity sake. These steps can be performed in any suitable order.

By way of a non-limiting example, the concepts as discussed herein can be applied to switching voltage regulators with a buck topology for application to low voltage processors, memory, digital ASICs, etc. The concept however is applicable to other topologies such as boost and buck-boost regulators.

It is to be understood that the system, method, apparatus, etc., as discussed herein can be embodied strictly as hardware, as a hybrid of software and hardware, or as software alone such as within a processor, or within an operating system or a within a software application. Example embodiments of the invention may be implemented within products and/or software applications such as those developed or manufactured by International Rectifier Corporation of El Segundo, Calif., USA.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As further described below, embodiments herein include a voltage isolation interface and related circuitry configured to employ novel transmit/receive signal bandwidth shaping and transient disturbance rejection. Application of the techniques allow for robust, high-speed digital communications across a high-voltage tolerant (galvanic) isolation barrier with exceptionally high transient immunity.

Figure 1:
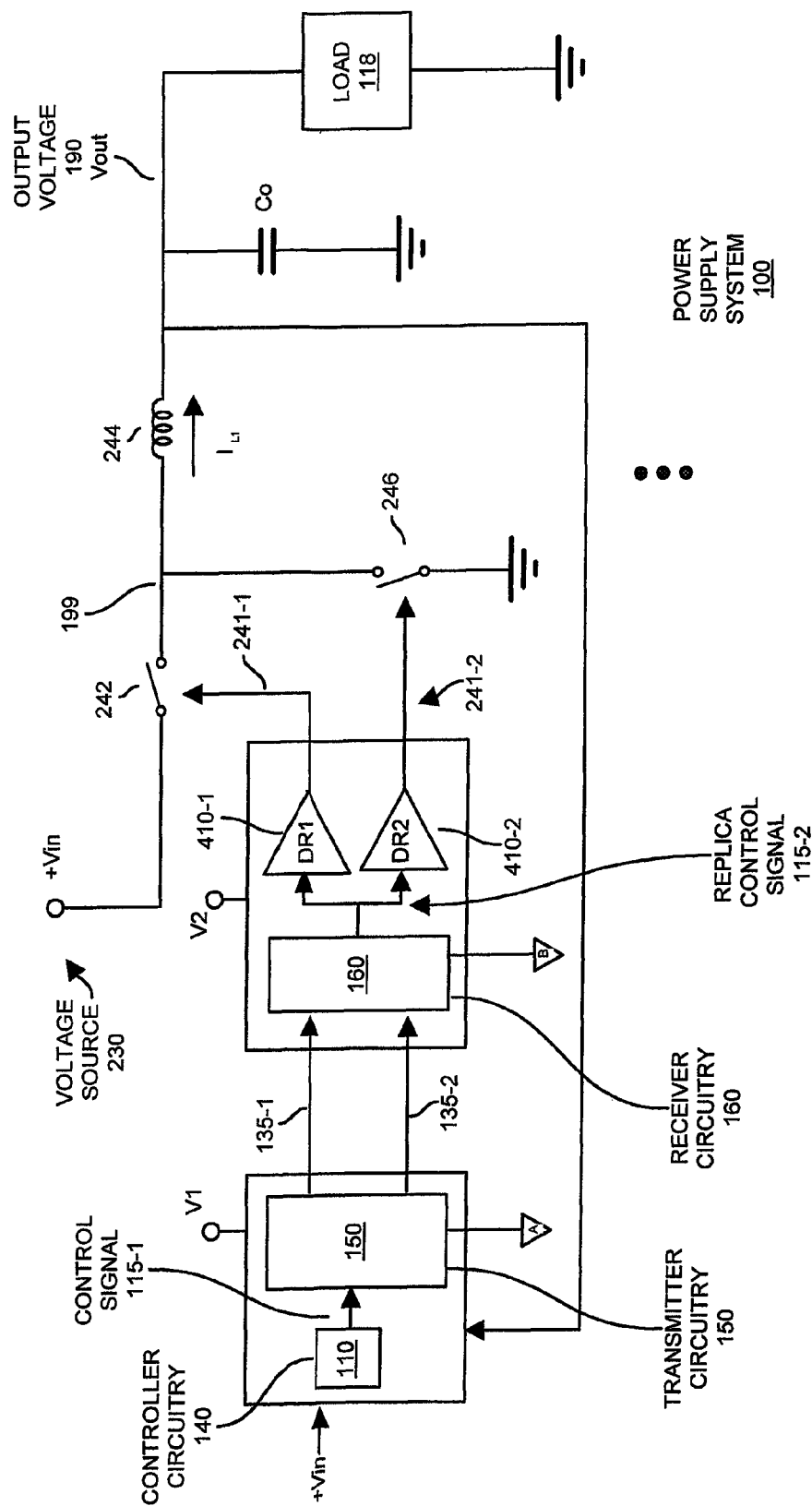
FIG. 1 is an example diagram of a power supply system including transmitter circuitry and receiver circuitry according to embodiments herein.

Now, more specifically, FIG. 1 is an example diagram of a power supply system 100 according to embodiments herein. Note that any or all portions of the logical depiction of power supply system 100 can be implemented via suitable analog and/or digital hardware components.

As shown, the power supply system 100 includes controller circuitry 140. As its name suggests, controller circuitry 140 controls an operation of drivers 410-1 and 410-2 (collectively, the driver 410) to maintain the output voltage 190 within a desired range.

In this example embodiment, controller circuitry 140 receives one or more inputs such as Vin, a current and/or past states of output voltage 190 (Vout), control setting information, etc., to control switches 242 and a 246 to produce output voltage 190. In one embodiment, the control setting information can be received from any suitable resource and specify a desired magnitude of the output voltage 190, which may vary over time.

In one embodiment, the controller circuitry 140 produces a magnitude of the output voltage 190 to be a magnitude as specified by the control setting information. Accordingly, if the control setting information indicates to control a magnitude of the output voltage 190 to a value of 0.6 VDC, the controller circuitry 140 initiates control of the switches 242 and 246 to respective ON and OFF states at different times such that the magnitude of the output voltage 190 is approximately 0.6 volts; if the control setting information indicates to control a magnitude of the output voltage 190 to a value of 0.8 V, the controller circuitry 140 controls switches 242 in 246 such that the magnitude of the output voltage 190 is approximately 0.8 volts; if the control setting information indicates to control a magnitude of the output voltage 190 to a value of 1.0 V, the controller circuitry 140 controls switches 242 and 246 such that the magnitude of the output voltage 190 is approximately 1.0 volts; and so on.

Switches 242 and 246 can be any suitable type of devices. For example, the switches can be field effect transistors, bipolar junction transistors, etc.

In one embodiment, based at least in part on comparison of the output voltage 190 received on the feedback path of power supply system 100 and a reference voltage derived from the control setting information, the controller circuitry produces control signal 115-1. The control signal 115-1 specifies how to control settings of corresponding switches 242 and 246.

Thus, based on the received inputs (such as control setting information, feedback of the output voltage 190, etc.), controller circuitry 140 outputs one or more control signals to control the control switch 242 (e.g., high side switch) and synchronous switch 246 (e.g., low side switch) to ON/OFF and OFF/ON states. Note that it is undesirable to activate both switch 242 and switch 246 at the same time.

More specifically, during a first ON/OFF state, the controller circuitry 140 produces an appropriate control signal 115-1 notifying the drive circuitry 410-1 to activate the control switch 242 to an ON state; at the same time, the control signal 115-1 notifies the driver circuitry 410-2 to deactivate the synchronous switch 246 to an OFF state.

Conversely, during an OFF/ON state, the controller circuitry 140 outputs control signal 115-1 downstream to drive circuitry 410-1 to deactivate the control switch 242 to an OFF state; at the same time, the controller circuitry 140 generates and transmits the signal 115-1 downstream to activate the synchronous switch 246 to an ON state.

Via switching of the control switch 150 and the synchronous switch 160 between ON/OFF states and OFF/ON states at different times as previously discussed, the controller circuitry 140 produces output voltage 190 to power load 118. The controller circuitry 140 controls timing of the control signal 115-1 and activation/deactivation of switches between logic states such that the output voltage 190 resides within a desirable range.

In general, during an ON/OFF state as previously discussed, when control switch 242 is turned ON (i.e., activated) via respective one or more control signals generated by controller circuitry 140 (while the synchronous switch 246 is OFF), the current through inductor resource 244 increases based on a highly conductive path provided by control switch 242 between voltage source 120 (such as a 12 VDC source) and inductor resource 244.

Conversely, during an OFF/ON state, when synchronous switch 246 is turned ON (i.e., activated) via control signal 115-1 as generated by controller circuitry 140 (while the control switch 242 is OFF), the current through inductor resource 244 decreases based on a highly conductive path provided by the synchronous switch 246 between the inductor resource 244 and ground as shown.

Further, as previously discussed, based on switching of the control switch 242 and the synchronous switch 246, the controller circuitry 140 regulates the output voltage 190 to a desired magnitude or range to power load 118.

Note that power supply system 100 can include multiple phases. Each of the multiple phases can be similar to and operate in a similar manner as the example phase shown in FIG. 1. In such an embodiment, the controller 100 operates a combination of the phases to maintain the output voltage 190 within a desired range to power load 118. The phases can be operated in phase or out of phase with respect to each other.

Each phase can include a respective high side switch circuit (control switch) and low side switch circuit (synchronous switch) as previously discussed. To deactivate a respective phase, the phase controller circuitry 140 can set both high side switch circuitry and low side switch circuitry of the respective phase to an OFF state. When off or deactivated, the respective phase does not contribute to producing current to power the load 118.

In certain instances, the controller circuitry 140 or other suitable resource can select how many phases to activate depending on an amount of current consumed by the load 118. For example, when the load 118 consumes a relatively large amount of current, the controller 100 can activate multiple phases to power the load 118. When the load 118 consumes a relatively small amount of current, the controller circuitry 140 can activate a single phase to power the load 118.

Figure 2:
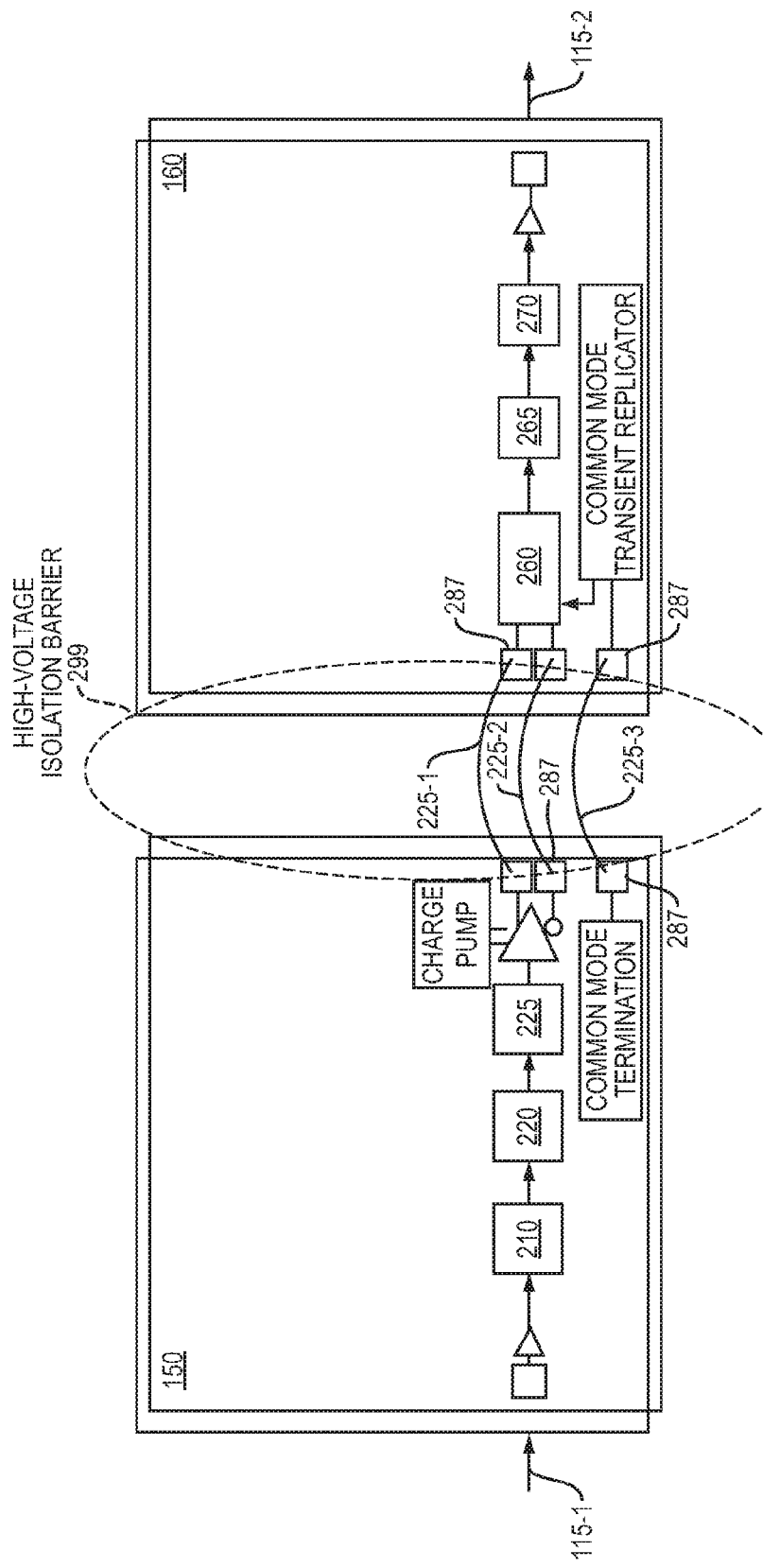
FIG. 2 is an example diagram illustrating a more detailed diagram of a voltage isolation barrier disposed between a transmitter circuitry (that encodes and transmits a data signal) and receiver circuitry (that receives and replicates the data signal) according to embodiments herein.

FIG. 2 is an example diagram illustrating an isolation interface and related components according to embodiments herein.

In one embodiment, the transmitter circuitry 150 is a first semiconductor device; the receiver circuitry 160 is a second semiconductor device. As further discussed below, the transmitter circuitry 150 is communicatively coupled to the receiver circuitry 160 via a high-voltage isolation barrier circuit 299. The barrier circuit 299 includes communication links 225-1, 225-2, 225-3, etc., to convey signals from the transmitter circuitry 150 to the receiver circuitry 160.

As shown, during operation, the transmitter circuitry 150 receives control signal 115-1 as generated by controller circuitry 140. The filter circuitry 210 compares a changing state and any pulse width in the control signal 150-1 to a predetermined value (such as between 2 and 20 nanoseconds). If the pulse width in the control signal 115-1 is greater than a programmed pulse width limit, the control signal 115-1 is conveyed downstream to the AC signal generator 220. If a detected pulse width (such as a transient or glitch) in the control signal 115-1 is less than the programmed pulse width limit, the filter circuitry 210 deems the pulse to be a transient condition such as noise. In such an instance, the filter circuit 210 filters out and prevents the transient from being further conveyed downstream to the AC signal generator 220.

After validation of a data transition via the filter circuitry 210, the transmitter circuitry 150 activates a programmable timer associated with the AC signal generator 220 (such as a chirp generator). If the timer terminates before another data transition is detected on the control signal 115-1, the AC signal generator 220 creates a valid data transition that is of the same polarity as the previous data transition so as to rebroadcast the last valid state downstream for transmission over the isolation barrier (such as communication links 225-1 and 225-2). In one embodiment, the communication links include one or more bond wires.

As will be further discussed later in the specification, transmission of the "chirp" or the supplemental AC signal across the isolation barrier allows the receiver circuitry 160 to perform operations such as proper power-up of the power supply circuitry, enter/exit of a fail-safe state and/or recover mode from a data transition error due to a disturbance phenomenon, etc.

In one embodiment, the isolation barrier 299 includes capacitive pads (disposed at termination ends of the communication links 225). The capacitive pads provide isolation because they enable passing of AC signals and blocking of DC signals. Recognizing that the isolation barrier is AC coupled via coupling capacitors which block DC energy and only pass higher frequency energy, embodiments herein include encoding the data state into a plus or minus finite duration pulse which is transmitted across the isolation barrier 299. In other words, as further described below, the "encoder" takes a data input state and converts it to a narrow pulse of proper polarity which is conducive to transmission across the AC coupled isolation barrier 299. To improve the Receiver Signal-to-Noise ratio for robust transmission across the isolation barrier 299, the transmitted signal over communication link 225-1 and 225-2 can be amplified via transmitter 250. As further discussed below, a simple "Common-Mode Termination" impedance is present on the transmit side of the "Common-Mode Discrimination Replicator"

path that mimics the data path transmit impedance. This path is used for high performance Common-Mode Discrimination.

Further during operation, the receiver 260 receives the signal or pulse transmitted across the isolation barrier over communication link 225. In one embodiment, the receiver circuit 260 supports common-mode discrimination. For example, in one embodiment, the receiver circuit 260 can be configured to provide relatively high differential impedance for minimal signal amplitude attenuation, while offering a relatively low common-mode impedance to help maintain proper common-mode bias at the receiver input when subjected to a common-mode transient.

To further provide immunity to common mode transient events along the data path, the common-mode transient replicator circuit 282 operates off the alternate isolation path. In one embodiment, only during a common-mode transient event is the common mode transmitter replicator circuit 282 activated.

Due to parasitic bottom-plate capacitance of the coupling capacitors (voltage isolation circuit components) and other parasitics in the pads 287, the receiver 260 (such as a differential receiver with common mode discrimination) receives a highly attenuated signal.

In accordance with further embodiments, after application of proper common-mode discrimination, via the receiver circuitry 260 and/or decoder circuitry 265, the differential signal is amplified, quantized, and decoded into a valid digital state that is identical to the original input state that was transmitted over the isolation barrier 299.

The receiver 260 forwards the received digital state associated with the conveyed signal to the AC signal detector 270 (such as a chirp detector circuit). The AC signal detector 270 validates and decodes a respective chirp in the received signal. If a valid transition does not occur within the prescribed chirp period, the receiver block enters a fail-safe state and forces the replicated control signal 115-2 and corresponding driver circuitry 410 to a benign pre-programmed default state. Otherwise, the AC signal detector 270 outputs the replicated control signal 115-2. Assuming no errors occur during transmission, the replicated control signal 115-2 is delayed but identical to the original received control signal 115-1.

Accordingly, in summary, the transmitter circuitry 150 receives control signal 115-1, encodes the control signal, and conveys the encoded control signal over a respective voltage isolation barrier 299 to receiver circuitry 160. The receiver circuitry 160 decodes the received encoded signal to produce replicated control signal 115-2.

Figure 3:
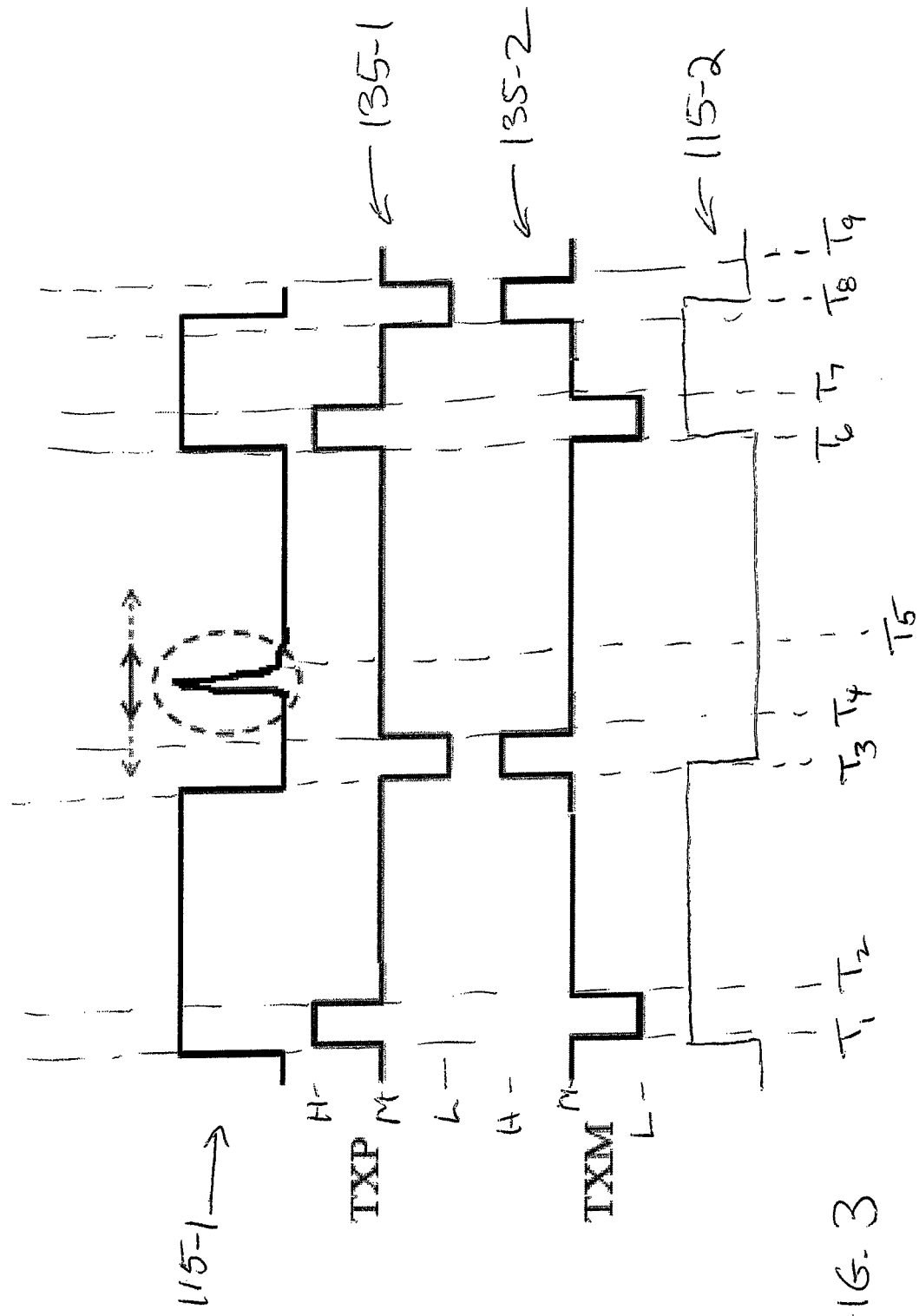
FIG. 3 is an example timing diagram illustrating encoding and filtering of a data signal according to embodiments herein.

FIG. 3 is an example timing diagram illustrating encoding and filtering of a control signal according to embodiments herein.

In this example embodiment, the transmitter circuitry 150 receives control signal 115-1. In a manner as previously discussed, the filter circuitry 210 filters the corresponding control signal 115-1 and forwards the filtered control signal to AC generator 220. Based on detected edges (such as rising edges and falling edges in the control signal 115-1), a combination of the AC generator circuit 220, the encoder circuit 225, and the transmitter 250 produces a differential signal including multi-state signals TXP and TXM. As further discussed below, the multi-states of each TXP/TXM signal includes: high (H), middle (M), and low (L) states.

The transmitter 250 transmits the TXP signal over communication link 225-1 (such as a bond wire or other suitable medium) to receiver 260. The transmitter 250 transmits the TXM signal over communication link 225-2 (such as a bond wire or other suitable medium) to receiver 260.

As shown, in this example embodiment, the first signal TXP mirrors the second signal TXM. That is, when the voltage level of the signal TXP is in a high state, the voltage level of the signal TXM is in a low state. Conversely, when the voltage level of the signal TXP is in a low state, the voltage level of the signal TXM is in a high state. In this respect, the signal TXM is inverted with respect to signal TXP.

As further shown, detection of the rising edge of the control signal 115-1 at or around time T1 causes the encoder circuitry 225 to simultaneously change: i) the TXP signal from a default middle state M to a high state H; and ii) the TXM signal from a default middle state M to a low state L. Encoding of the differential signal in this manner indicates that the control signal 115-1 is in a logic high state. At or around time T2, after the duration of a respective chirp (supplemental AC signal), the encoder circuitry 225 sets both signal TXP and signal TXM to respective middle states.

As previously discussed, the receiver circuitry 160 includes receiver 260 configured to receive the differential signal TXP/TXM. Via the decoder circuitry 265 and AC signal detector 270, the receiver circuitry 160 reproduces the replicated control signal 115-2. That is, upon detecting the simultaneous transition of signal TXP from a midstate to a high state and transition of TXM signal from the midstate to the low state between times T1 and T2, the receiver circuitry 160 produces the replicated control signal 115-2 to be a logic high state.

As further shown, subsequent detection of the falling edge of the control signal 115-1 at or around time T3 causes the encoder circuitry 225 to simultaneously change states of: i) the TXP signal from a default middle state M to a logic low state L; and ii) the TXM signal from a default middle state M to a logic high state H. Encoding of the differential signal in this manner indicates (to the receiver circuitry 160) that the control signal 115-1 is in a logic low state again. At or around time T4, after the duration of a respective chirp (supplemental AC signal), which is of a duration as specified by the AC signal generator circuit 220, the encoder circuitry 225 sets both signal TXP and signal TXM to respective middle states again.

Upon detecting the simultaneous transition of signal TXP from a midstate to a low state and transition of TXM signal from the midstate to the high state between times T3 and T4, the receiver circuitry 160 produces the replicated control signal 115-2 to be a low state.

In this manner, the transmitter circuitry 150 conveys the states of the control signal 115-1 via a transmission of the TXP signal over communication link 225-1 and transmission of the signal TXM over communication link 225-2 to the differential receiver 260.

In this example embodiment, as shown, a frequency of the supplemental (AC) transient signal (chirp signal) is greater than a frequency of changing states of the control signal 115-1. Presence of the supplemental AC signal (and corresponding edges) in the differential signals TXP/TXM notifies the receiver circuitry 160 of current DC states of the control signal 115-1 being reproduced.

Note that the control signal 115-1 may be susceptible to transient conditions as shown at time T5. In this example embodiment, the filter circuitry 210 detects occurrence of the transient (glitch) at or around T5 and prevents the glitch from passing downstream to the AC signal generator circuit 220 and encoder circuitry 225. Accordingly, the encoder circuitry 225 does not reproduce the glitch for transmission over the differential signal TXP/TXM.

Figure 4:
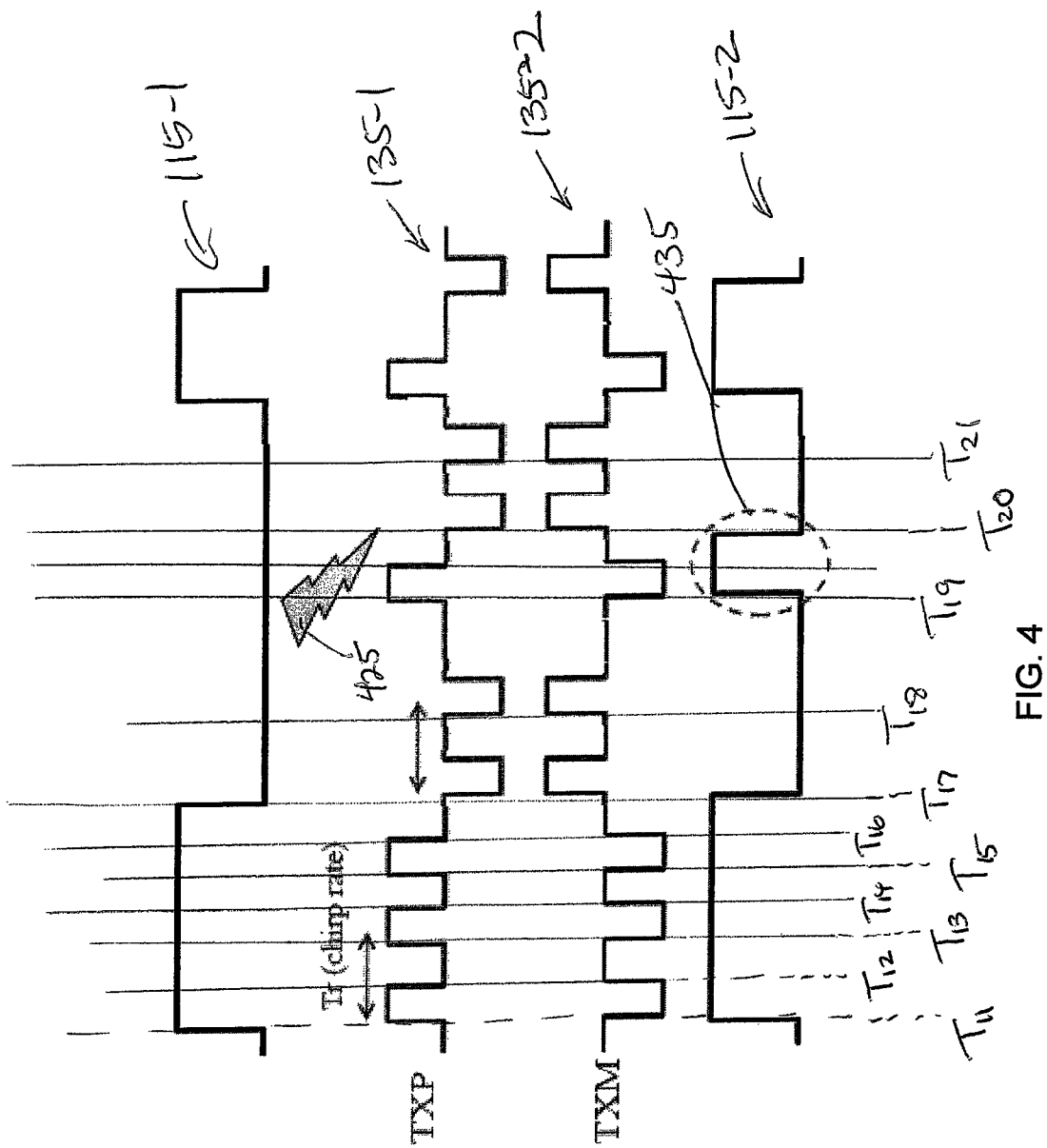
FIG. 4 is an example timing diagram illustrating encoding of a signal and recovery from a transient condition according to embodiments herein.

FIG. 4 is an example timing diagram illustrating encoding of a control signal and recovery from a transient condition according to embodiments herein.

Presence of the supplemental AC signals (so-called chirps between time T11 and T12, T13 and T14, etc.) in the differential signal TXP/TXM repeatedly provides notification of a current DC state of the encoded input signal to a respective receiver. For example, the transition of the TXP signal at time T11 from the middle state to the high state and transition of the TXM signal from the middle state to the low state indicates to receiver circuitry 160 that the control signal 115-1 is logic high; subsequent transition of the TXP signal at time T13 from the middle state to the high state and transition of the TXM signal from the middle state to the low state indicates to the receiver circuit 160 that the control signal 115-1 is logic high; the transition of the TXP signal at time T15 from the middle state to the high state and transition of the TXM signal from the middle state to the low state indicates to the receiver circuit 160 that the control signal 115-1 is logic high; etc. Accordingly, the receiver circuitry 160 generates the replicated control signal 115-2 to be a respective logic high during such times.

Note that communication link 225 as described herein may be susceptible to exposure to transient conditions. To mitigate exposure to the transient conditions, in a manner as previously discussed, upon detecting a change in state of the control signal 115-1 from a logic low to a logic high state, the transmitter circuitry 150 generates TXP signal and the TXM signal to include repeat occurrences of the AC signal for chirp in the encoded control signal transmitted over the communication link 225.

Additionally, at time T17 when the control signal 115-1 switches from a logic high to a logic low state, the transmitter circuitry 150 produces the TXP/TXM signal as shown. The transition of the TXP signal at time T17 from the middle state to the low state and transition of the TXM signal from the middle state to the high state indicates to the receiver circuitry 160 that the control signal 115-1 is logic low; transition of the TXP signal at time T17 from the middle state to the low state and transition of the TXM signal from the middle state to the high state indicates to receiver circuitry 160 that the control signal 115-1 is logic low; and so on.

As further shown, at or around time T19, the transmitter circuitry 150, the communication link 225, and/or receiver circuitry 160 is exposed to transient condition 425 such as lightning, electrostatic discharge, etc.

As shown, assume that the transient condition 425 erroneously causes the TXP signal to transition from a middle state to a respective high state and the TXM signal to transition from the midstate to the low state. This is an error and does not represent the state of the control signal 115-1 at time T19. The receiver circuitry 160 detects this as a transition of the original control signal 115-1 from the logic low state to a logic high state. Accordingly, the receiver circuitry 160 produces the replicated control signal 115-2 to include erroneous setting 435 (a short duration logic high state).

However, because the encoding is repetitive in nature using the supplemental AC signals (chirps), subsequent to the transient condition 425, the transmitter circuitry 150 continues to repeat the pattern of notifying the receiver circuitry 160 that the control signal 115-1 is set to a logic low state. As previously discussed, this includes, at or around time T20, performing a recovery including transitioning the TXP signal from a middle state to a logic low state and transitioning the TXM signal from a middle state to a logic high state.

Thus, even though transient condition 425 causes occurrence of the erroneous setting 435 in the replicated control signal 115-2, the repeated transmission of a state of the control signal 115-1 using chirps (supplemental AC signal) enables the transmitter circuitry 150 and receiver circuitry 160 to immediately correct the erroneous setting 435 such that the replicated control signal 115-2 matches the original control signal 115-1 again.

Accordingly, presence of the supplemental transient signal (such as AC signal, chirps, etc.) encoded in the differential signal conveyed over communication link 225 repeatedly transmits a same DC state (logic high state) of the original control signal 115-1 through voltage isolator circuitry (high-voltage isolation barrier 299) for a duration of time between time T11 and T17 to a respective receiver circuit 160 that decodes the received differential signal into replicated control signal 115-2.

Referring again to FIG. 1, note that the replicated control signal 115-2 can be used to control states of the control switch 242 and synchronous switch 246 in power supply system 100. In one instance as previously discussed, the receiver circuitry 160 is voltage isolated with respect to the transmitter circuitry 150. The driver circuitry 410 utilizes the replicated control signal 115-2 to control states of the control switch 242 and synchronous switch 246 in accordance with the original control signal 115-1.

When the replicated control signal 115-2 is in a logic high state, the driver circuitry 410 activates switch 242 to an ON state and deactivates switch 246 to an OFF state. Conversely, when the replicated control signal 115-2 is in a logic low state, the driver circuitry 410 activates switch 246 to an ON state and deactivates switch 242 to an OFF state.

At times when the receiver circuitry 160 does not detect presence of appropriate transitions (chirps) in the differential signal including TXP/TXM signals, the receiver circuitry 160 initiates a failsafe control condition including deactivation of both the control switch 242 and synchronous switch 246.

Note further that embodiments herein can be deployed in any suitable application. By way of non-limiting example, embodiments herein can be deployed in high-speed, low latency digital communications across a high-voltage galvanic isolation barrier including: High-Voltage Integrated Circuit (HVIC) Industrial Motor Applications, Hybrid-Electric-Vehicles (HEV) Electronics Applications, Class D Audio Applications, High-Speed/High-Voltage GaN Switch Applications, etc.

Figure 5:
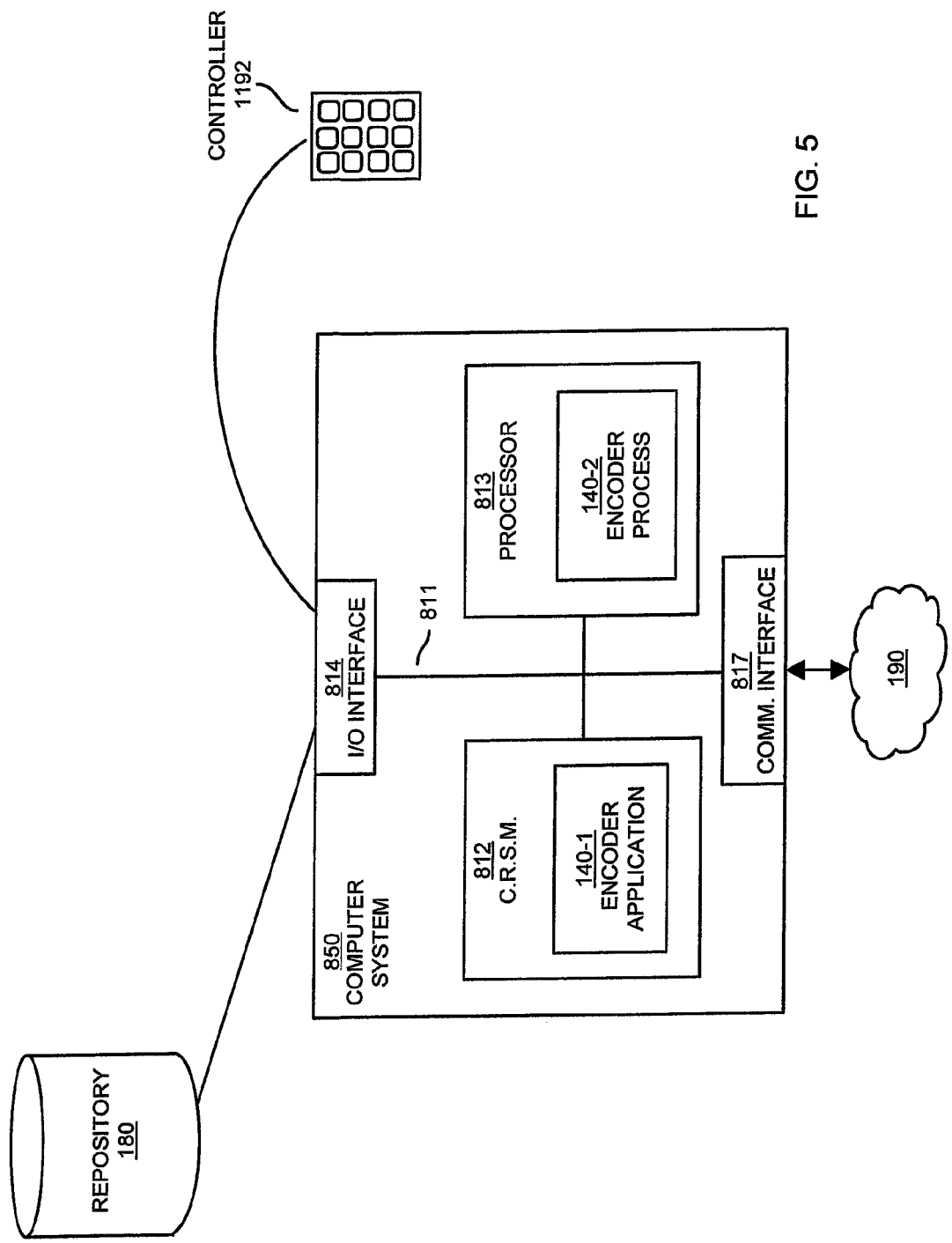
FIG. 5 is an example diagram illustrating a computer architecture to execute any operations according to embodiments herein.

FIG. 5 is a diagram illustrating an example computer architecture in which to execute any of the functionality according to embodiments herein. Any of the different processing operations as executed by power supply system 100 can be implemented via execution of software code, logic, hardware circuitry, etc., on a computer system.

For example, in one embodiment as shown, computer system 850 (e.g., such as computer processor hardware) of the present example can include an interconnect 811 that couples computer readable storage media 812 such as a non-transitory type of media (i.e., any type of hardware storage medium) in which digital information can be stored and retrieved. The computer system 850 can further include processor resource 813 (i.e., computer processor hardware such as one or more co-located or disparately located processor devices), I/O interface 814, communications interface 817, etc.

Computer processor hardware (i.e., processor 813) can be located in a single location or can be distributed amongst multiple locations.

As its name suggests, I/O interface 814 provides connectivity to external resources such as storage devices (such as storage device 180), control devices (such as input resource 1192), one or more display screens, etc.

Computer readable storage medium 812 can be any hardware storage device to store data such as memory, optical storage, hard drive, floppy disk, etc. In one embodiment, the computer readable storage medium 812 stores instructions and/or data.

Communications interface 817 enables the computer system 850 and processor resource 813 to communicate over a resource such as any of networks 190, shared communication link 191, etc. I/O interface 814 enables processor resource 813 to access data from a local or remote location, control a respective display screen, receive input, etc.

As shown, computer readable storage media 812 can be encoded with encoder application 140-1 (e.g., software, firmware, etc.) executed by processor resource 813. Encoder application 140-1 can be configured to include instructions to implement any of the operations as discussed herein.

During operation of one embodiment, processor resource 813 accesses computer readable storage media 812 via the use of interconnect 811 in order to launch, run, execute, interpret or otherwise perform the instructions in encoder application 140-1 stored on computer readable storage medium 812.

Execution of the encoder application 140-1 produces processing functionality such as encoder process 140-2 in processor resource 813. In other words, the encoder process 140-2 associated with processor resource 813 represents one or more aspects of executing encoder application 140-1 within or upon the processor resource 813 in the computer system 850.

Those skilled in the art will understand that the computer system 850 can include other processes and/or software and hardware components, such as an operating system.

Figure 6:
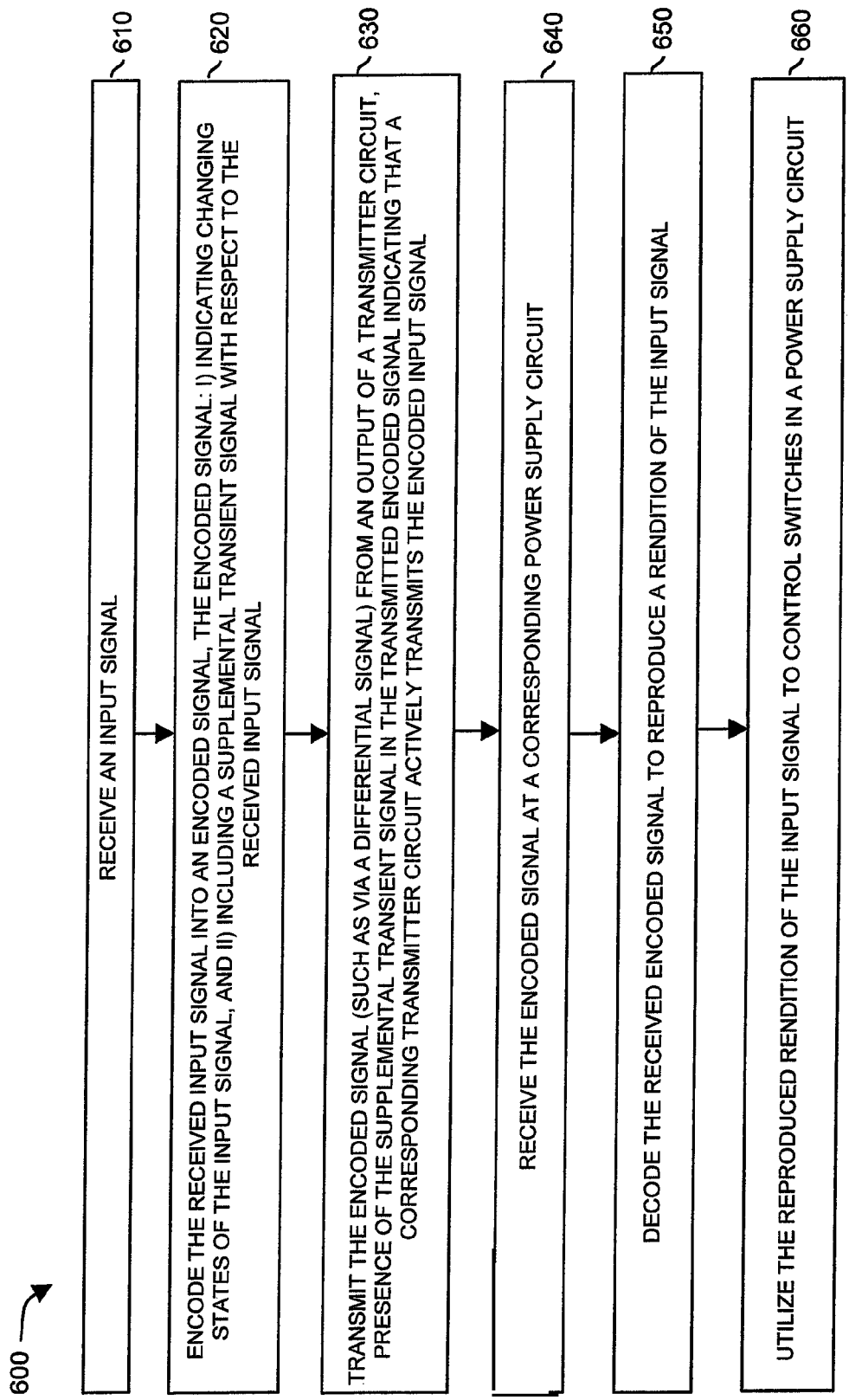
FIG. 6 is an example diagram of a flowchart illustrating a method and power supply control according to embodiments herein.

FIG. 6 is a flowchart 600 illustrating an example method of a communication technique according to embodiments herein. Note that there will be some overlap with respect to concepts as discussed above. Also, the steps can be executed in any suitable order.

In processing block 610, the transmitter circuitry 150 receives control signal 115-1 (an input data signal).

In processing block 620, the encoder circuitry 225 of transmitter circuitry 150 encodes the received control signal 115-1 as an encoded signal 135. In one embodiment, the encoded signal 135 is a differential signal including encoded signal 135-1 (TXP) and encoded signal 135-2 (TXM). The encoded signal 135: i) indicates changing states of the control signal 115-1, and ii) includes a supplemental transient signal (such as chirps) as generated by the AC signal generator 220.

In processing block 630, the transmitter circuitry 150 transmits the encoded signal 135 (such as differential signal TXP/TXM) from one or more respective output pads of the transmitter circuitry 150 over communication links 225 to respective input pads of receiver circuitry 160. As previously discussed, presence of the supplemental transient signal (as generated by the AC signal generator 220) in the transmitted encoded signal 135 indicates to the receiver circuitry 160 that the transmitter circuitry 150 is healthy and actively transmits the encoded signal 135. In one embodiment, the transmitter circuitry 150 transmits the encoded signal 135 through a voltage isolator circuitry (such as including a respective HV metal-metal capacitor under each respective output pad of the transmitter circuitry 150 and input pads of the receiver circuitry 160) to respective receiver circuitry 160. In general, as previously discussed, the voltage isolator circuitry components (such as capacitive pads) pass AC attributes of the transmitted encoded signal 135 to the respective receiver circuitry 160 and block DC attributes of the encoded signal 135 from being passed to the respective receiver circuitry 160.

In processing block 640, the receiver circuitry 160 receives the encoded signal 135 transmitted over communication link 225.

In processing block 650, the decoder circuitry 265 in receiver circuitry 160 decodes the received encoded signal 135 to generate replicated control signal 115-2, which is a reproduced rendition of the control signal 115-1.

In processing block 660, the receiver circuitry 160 utilizes the reproduced control signal 115-2 to control resources such as switches 242 and 246 in a respective power supply circuit.

Note again that techniques herein are well suited for reliably conveying a data signal to control a remote power supply circuit such as control/synchronous switches in a switching power supply application. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
   a first circuit comprising:
   an input to receive an input signal;
   an encoder circuit, the encoder circuit encoding the received input signal into an encoded signal, the encoded signal: i) indicating changing states of the input signal, and ii) including a supplemental transient signal with respect to the received input signal, the encoder circuit operable to vary a polarity of pulses in the supplemental transient signal depending on the changing states of the input signal; and
   a transmitter, the transmitter transmitting the encoded signal from an output of the first circuit.

2. The apparatus as in claim 1, wherein presence of the supplemental transient signal in the encoded signal indicates that the first circuit actively transmits the encoded signal.

3. The apparatus as in claim 2 further comprising:
   voltage isolator circuitry disposed between the output of the first circuit and a respective receiver circuit, the voltage isolator circuitry passing AC attributes of the encoded signal to the respective receiver circuit and blocking DC attributes of the encoded signal from being passed to the respective receiver circuit.

4. The apparatus as in claim 3, wherein the transmitter transmits the encoded signal as a differential signal to a second circuit that decodes the differential signal into a reproduced rendition of the input signal.

5. The apparatus as in claim 4, wherein the differential signal includes a first signal and a second signal, the first signal mirroring the second signal; and wherein the voltage isolator circuitry includes a first voltage isolator circuit and a second voltage isolator circuit, the transmitter transmitting the first signal through the first voltage isolator circuit to the respective receiver circuit, the transmitter transmitting the second signal to the second voltage isolator circuit to the respective receiver circuit.

6. The apparatus as in claim 1, wherein a frequency of the supplemental transient signal is greater than a frequency of the input signal, the transient signal repeatedly transmitting a notification of a DC state of the encoded input signal to a respective receiver.

7. The apparatus as in claim 1, wherein the transmitter transmits the encoded signal as a differential signal to a second circuit, the second circuit including a decoder circuit that decodes the differential signal to reproduce a rendition of the input signal.

8. The apparatus as in claim 7, wherein the transient signal encoded in the differential signal repeatedly transmits a same DC state of the input signal through voltage isolator circuitry for a duration of time to a respective receiver that decodes the received differential signal.

9. The apparatus as in claim 1 further comprising:
a second circuit;
a communication link extending from the transmitter in the first circuit to a receiver in the second circuit; and
wherein the first circuit is voltage isolated with respect to the second circuit, the second circuit including a high side switch and low side switch, the second circuit controlling states of the high side switch and low side switch based on the encoded signal outputted from the first circuit.

10. The apparatus as in claim 1, wherein the encoded signal transmitted by the transmitter is a differential signal including a first signal and a second signal, the first signal being a multi-state signal, the second signal being a multi-state signal, the first signal inverted with respect to the second signal.

11. A method comprising:
receiving an input signal;
encoding the received input signal as an encoded signal, the encoded signal: i) indicating changing states of the input signal, and ii) including a supplemental transient signal with respect to the received input signal;
the supplemental transient signal of the encoded signal including a first sequence of pulses and a second sequence of pulses, the first sequence of pulses modulated in a first voltage range to indicate a first state of the input signal, the second sequence of pulses modulated in a second voltage range to indicate a second state of the input signal; and
transmitting the encoded signal from an output of the first circuit.

12. The method as in claim 11, wherein presence of the supplemental transient signal in the transmitted encoded signal indicates that a corresponding first circuit actively transmits the encoded input signal.

13. The method as in claim 12, wherein transmitting the encoded signal further comprises:
transmitting the encoded signal through voltage isolator circuitry to a respective receiver circuit, the voltage isolator circuitry passing AC attributes of the transmitted encoded signal to the respective receiver circuit and blocking DC attributes of the encoded signal from being passed to the respective receiver circuit.

14. The method as in claim 13, wherein the transmitter transmits the encoded signal as a differential signal, the method further comprising:
decoding the differential signal into a replica rendition of the input signal.

15. The method as in claim 14 further comprising:
producing the differential signal to include a first signal mirroring a second signal;
transmitting the first signal through a first voltage isolator circuit to a receiver circuit; and
transmitting the second signal to the second voltage isolator circuit to the respective receiver circuit.

16. The method as in claim 11, wherein a frequency of the supplemental transient signal is greater than a frequency of the input signal, the transient signal repeatedly transmitting a notification of a DC state of the encoded input signal to a respective receiver.

17. The method as in claim 11 further comprising:
transmitting the encoded input signal as a differential signal to a receiver circuit; and
decoding the differential signal to reproduce a rendition of the input signal.

18. The method as in claim 17 further comprising:
including the transient signal in the encoded input signal to repeatedly transmit a same DC state of the input signal through voltage isolator circuitry to a respective receiver that decodes the received differential signal.

19. The method as in claim 11 further comprising:
transmitting the encoded input signal as a differential signal including a first signal and a second signal, the first signal being a multi-state signal, the second signal being a multi-state signal.

20. The method as in claim 19 further comprising:
producing the first signal to mirror the second signal, the first signal being inverted with respect to the second signal.

21. The apparatus as in claim 1, wherein the supplemental transient signal includes a first sequence of pulses and a second sequence of pulses, the first sequence of pulses generated during a first duration of time, the second sequence of pulses generated during a second duration of time, the first sequence of pulses indicating that the input is set to a first state for the first duration, the second sequence of pulses indicating that the input is set to a second state for the second duration.

22. The apparatus as in claim 21, wherein the first sequence of pulses resides within a first voltage range; and
wherein the second sequence of pulses resides within a second voltage range, the first voltage range different than the second voltage range.

23. The apparatus as in claim 22, wherein a magnitude of the supplemental transient signal varies between a first voltage value, a second voltage value, and a third voltage value, the second voltage value falling between the first voltage value and the second voltage value.

24. The apparatus as in claim 23, wherein the first voltage range falls between the first voltage value and the second voltage value; and
wherein the second voltage range falls between the second voltage value and the third voltage value.

25. The apparatus as in claim 21, wherein the first sequence of pulses is generated in accordance with a first polarity, the first sequence of pulses falling within a first voltage range; and wherein the second sequence of pulses is generated in accordance with a second polarity, the second polarity opposite the for polarity, the second sequence of pulses falling a second voltage range.

26. The apparatus as in claim 22, wherein the first sequence of pulses is generated in accordance with a first polarity within a first voltage range; and wherein the second sequence of pulses is generated in accordance with a second polarity within a second voltage range, the second polarity opposite the first polarity.

27. The apparatus as in claim 1, wherein the pulses in the supplemental transient signal include a first sequence of pulses corresponding to a first state of the input, the first sequence of pulses modulated between a first voltage value and a second voltage value; and wherein the pulses in the supplemental transient signal include a second sequence of pulses corresponding to a second state of the input, the second sequence of pulses modulated between the first voltage value and a third voltage value.

28. The apparatus as in claim 26, wherein the first voltage value falls between the second voltage value and the third voltage value.

29. The apparatus as in claim 28 further comprising:
a second circuit;
a communication link extending from the transmitter in the first circuit to a receiver in the second circuit; and
wherein the first circuit is voltage isolated with respect to the second circuit, the second circuit including a high side switch and low side switch, the second circuit controlling states of the high side switch and low side switch based on the encoded signal outputted from the first circuit.

30. The apparatus as in claim 10, wherein the encoder circuit is operable to, for a first duration corresponding to a first state of the changing states: i) modulate the first signal between a reference voltage and a first voltage, and ii) modulate the second signal between the reference voltage and a second voltage; and wherein the encoder circuit is further operable to, for a second duration corresponding to a second state of the changing states: i) modulate the first signal between a reference voltage and the second voltage, and ii) modulate the second signal between the reference voltage and the first voltage.

31. The apparatus as in claim 30, wherein the second signal mirrors the first signal with respect to the reference voltage.

32. The method as in claim 11, wherein the first voltage range is defined by a reference voltage and a first voltage, the first voltage greater than the reference voltage; and wherein the second voltage range is defined by the reference voltage and a second voltage, the second voltage less than the reference voltage.

33. The method as in claim 11, wherein the supplemental transient signal of the encoded signal includes a first sequence of pulses and a second sequence of pulses, the first sequence of pulses modulated in accordance with a positive polarity with respect to a reference voltage to indicate a first state of the input signal, the second sequence of pulses modulated in accordance with a negative polarity with respect to the reference voltage to indicate a second state of the input signal.

* * * * *